`US008536627B2`

(12) United States Patent
Guo et al.

(10) Patent No.: US 8,536,627 B2
(45) Date of Patent: Sep. 17, 2013

(54) CARBON IMPLANT FOR WORKFUNCTION ADJUSTMENT IN REPLACEMENT GATE TRANSISTOR

(71) Applicant: International Business Machines Corporation, Armonk, NY (US)

(72) Inventors: Dechao Guo, Fishkill, NY (US); Shu-Jen Han, Cortlandt Manor, NY (US); Keith Kwong Hon Wong, Wappingers Falls, NY (US); Jun Yuan, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/623,162

(22) Filed: Sep. 20, 2012

(65) Prior Publication Data

US 2013/0093021 A1   Apr. 18, 2013

Related U.S. Application Data

(63) Continuation of application No. 13/272,349, filed on Oct. 13, 2011.

(51) Int. Cl.
  *H01L 29/80* (2006.01)
(52) U.S. Cl.
  USPC .......................................... 257/285; 257/607
(58) Field of Classification Search
  USPC ................. 257/285, 391, 392, 607, E21.049, 257/E21.065
  See application file for complete search history.

(56) References Cited

U.S. PATENT DOCUMENTS

| | | | |
|---|---|---|---|
| 6,258,695 B1 | 7/2001 | Dunn et al. | |
| 6,660,577 B2* | 12/2003 | Chen et al. | 438/199 |
| 7,396,717 B2 | 7/2008 | Wang et al. | |
| 7,402,872 B2 | 7/2008 | Murthy et al. | |
| 7,582,547 B2 | 9/2009 | Pawlak | |
| 7,678,637 B2 | 3/2010 | Nandakumar et al. | |
| 7,700,450 B2 | 4/2010 | Lee et al. | |
| 7,714,358 B2 | 5/2010 | Liu et al. | |
| 2010/0148271 A1 | 6/2010 | Lin et al. | |
| 2012/0007194 A1 | 1/2012 | Sakakidani | |
| 2012/0049293 A1* | 3/2012 | Scheiper et al. | 257/392 |
| 2012/0068193 A1 | 3/2012 | Chan et al. | |

FOREIGN PATENT DOCUMENTS

KR   20100096050 A   9/2010

OTHER PUBLICATIONS

Combined Search and Examination Report under Sections 17 and 18(3) for corresponding EP Patent Application No. GB1212471.5 mailed Dec. 3, 2012.

J. W. Strane et al., "Carbon incorporation into Si at high concentrations by ion implantation and solid phase epitaxy," J. Appl. Phys. vol. 79, 1996, pp. 637-646.

(Continued)

*Primary Examiner* — Quoc Hoang
(74) *Attorney, Agent, or Firm* — Harrington & Smith

(57) ABSTRACT

A transistor includes a semiconductor body having a channel formed in the semiconductor body; a high dielectric constant gate insulator layer disposed over a surface of an upper portion of the channel; and a gate metal layer disposed over the high dielectric constant gate insulator layer. The channel contains Carbon implanted through the gate metal layer, the high dielectric constant gate insulator layer and the surface to form in the upper portion of the channel a Carbon-implanted region having a substantially uniform concentration of Carbon selected to establish a voltage threshold of the transistor.

20 Claims, 5 Drawing Sheets

(56) References Cited

OTHER PUBLICATIONS

J. Pan et al., "A low-temperature metal-doping technique for engineering the gate electrode of replacement metal gate CMOS transistors," IEEE Electron Device Letters, vol. 24, Issue 9, 2003, pp. 547-549.

H. N. Alshareef et al., "Impact of Carbon Incorporation on the Effective Work Function of WN and TaN Metal Gate Electrodes," Electrochem. Solid-State Lett., vol. 11, Issue 7, 2008, pp. H182-H184.

A. Hokazono et al., "Steep channel & Halo profiles utilizing boron-diffusion-barrier layers (Si:C) for 32 nm node and beyond," Symposium on VLSI Technology, 2008, pp. 112-113.

B. Yang et al., "High-performance nMOSFET with in-situ phosphorus-doped embedded Si:C (ISPD eSi:C) source-drain stressor," IEDM Tech Dig, 2008. pp. 51-54.

\* cited by examiner

CARBON IMPLANT FOR WORKFUNCTION ADJUSTMENT IN REPLACEMENT GATE TRANSISTOR

CROSS-REFERENCE TO A RELATED PATENT APPLICATION

This patent application is a continuation patent application of copending U.S. patent application Ser. No. 13/272,349, filed Oct. 13, 2011, the disclosure of which is incorporated by reference herein in its entirety.

TECHNICAL FIELD

The exemplary embodiments of this invention relate generally to semiconductor devices and fabrication techniques and, more specifically, relate to the fabrication of semiconductor transistor devices, such as field effect transistors (FETs) used in random access memory (RAM) and logic circuitry, using a bulk or silicon-on-insulator (SOI) substrate, and further relate to replacement gate processes and to the implanting of Carbon (C) ions into semiconductor devices.

BACKGROUND

In efforts to avoid some of the drawbacks associated with polysilicon gate electrodes, replacement damascene metal gate processes have been devised. A damascene metal gate process forms a device with a disposable (dummy) gate, with a source, drain, spacer, etc., as in conventional processing. The disposable gate and dielectrics are etched away, exposing an original gate oxide. The disposable polysilicon gate is then replaced by a metal gate to achieve the lower resistivity provided by the metal material. General reference with respect to a replacement gate process can be made, as one non-limiting example, to commonly assigned U.S. Pat. No. 7,091,118 B1, "Replacement Metal Gate Transistor with Metal-Rich Silicon Layer and Method of Forming Same", James Pan, John Pellerin, Linda R. Black, Michael Chudzik and Rajarao Jammy.

In silicon on insulator (SOI) technology a thin silicon layer is formed over an insulating layer, such as silicon oxide, which in turn is formed over a bulk substrate. This insulating layer is often referred to as a buried oxide (BOX) layer or simply as a BOX. Sources and drains of field effect transistors (FETs) are formed by the addition of N-type and/or P-type dopant material into the thin silicon layer, with a channel region being disposed between the source and drain.

It has become desirable to achieve a low threshold voltage (Vt) for transistors that operate with a scaled (reduced) value of Vdd.

SUMMARY

In accordance with the exemplary embodiments of this invention there is provided a transistor that comprises a semiconductor body having a channel formed in the semiconductor body; a high dielectric constant gate insulator layer disposed over a surface of an upper portion of the channel; and a gate metal layer disposed over the high dielectric constant gate insulator layer. The channel contains Carbon implanted through the gate metal layer, the high dielectric constant gate insulator layer and the surface to form in the upper portion of the channel a Carbon-implanted region having a substantially uniform concentration of Carbon selected to establish a voltage threshold of the transistor.

Further in accordance with the exemplary embodiments of this invention there is provided a structure that comprises a layer of semiconductor material; a first field effect transistor formed at least partially in the layer of semiconductor material; and a second field effect transistor formed at least partially in the layer of semiconductor material. In the structure the first field effect transistor is comprised of a gate insulator layer disposed over a surface of a channel formed in the layer of semiconductor material and a gate metal layer disposed over the gate insulator layer, where the channel of the first field effect transistor containing Carbon is implanted through the gate metal layer, the gate insulator layer and the surface to form in the channel a Carbon-implanted region having a substantially uniform concentration of Carbon selected to establish a voltage threshold of the first field effect transistor. In the structure the second field effect transistor is comprised of a gate insulator layer disposed over a surface of a channel formed in the layer of semiconductor material and a gate metal layer disposed over the gate insulator layer, where the channel of the second field effect transistor containing Carbon is implanted through the gate metal layer, the gate insulator layer and the surface to form in the channel a Carbon-implanted region having a substantially uniform concentration of Carbon selected to establish a voltage threshold of the second field effect transistor.

BRIEF DESCRIPTION OF THE SEVERAL VIEWS OF THE DRAWINGS

FIG. 1A shows a starting wafer structure that includes a semiconductor substrate, an electrically insulating layer buried oxide (BOX) layer, an SOI layer, shallow trench isolation (STI) and a patterned insulator such as a middle-of-line (MOL) insulator;

FIG. 1B shows a result of an unpatterned deposition of a high dielectric constant (high-k) gate insulator layer;

FIG. 1C shows a result of a deposition of an unpatterned gate metal layer that is deposited directly on a top surface of the unpatterned high-k dielectric layer; and FIG. 1D shows the selective implanting of Carbon into what will become the channel region of one transistor.

DETAILED DESCRIPTION

In accordance with the exemplary embodiments of this invention the threshold voltage of a transistor is selectively adjusted. During transistor fabrication a Carbon implant into what will be the transistor channel is used to adjust the transistor threshold voltage. By introducing Carbon with different doses transistors with different Vt can be provided on the same substrate. Described below is an exemplary process flow that uses a method to adjust the threshold voltage when a replacement gate process is used to fabricate the transistors.

The exemplary embodiments will be described below in the non-limiting context of a replacement gate process that uses source-drain regions formed in an SOI layer adjacent to a channel regions also formed in the SOI. However it should be realized that in other embodiments of this invention the transistor can be fabricated to include raised source-drain structures. In addition, in other embodiments a bulk semiconductor substrate can be used as opposed to the SOI.

The exemplary embodiments of this invention provide a method for forming a bulk or SOI or an ETSOI (extremely thin SOI)) device, such as a FET device, with a reduced Vt achieved by implanting Carbon into the channel so that it lies substantially only beneath a gate stack, thereby influencing the gate stack workfunction and establishing a desired reduced value of Vt. The embodiments of this invention also encompass a structure that is fabricated in accordance with the method. It should be noted that the channel can be formed in a semiconductor layer that is Silicon, or a Silicon alloy such as Silicon-Germanium, or in any of a number of different types of semiconductor materials that are suitable for fabricating transistors such as FETs.

Figure 1A:
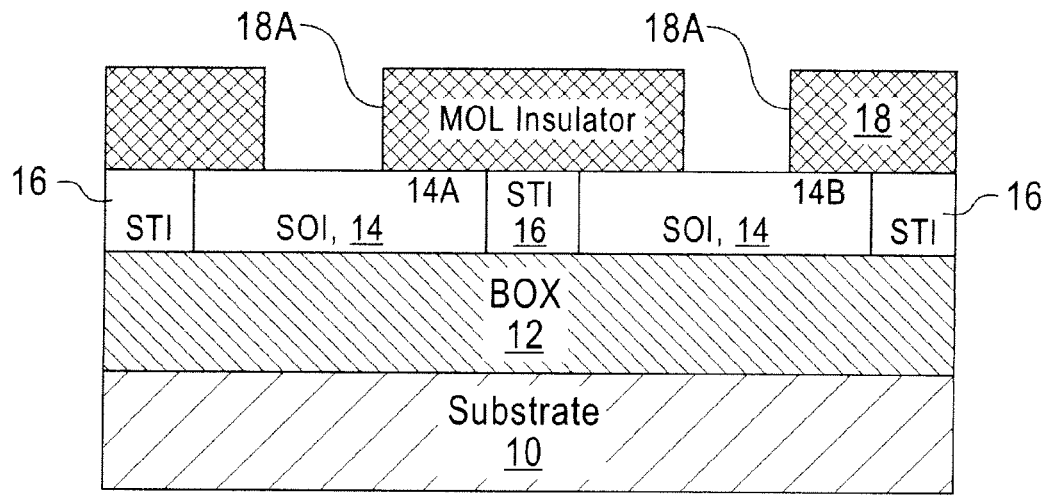
FIGS. 1A-1D, collectively referred to as FIG. 1, each present a cross-sectional enlarged view (not to scale) of a portion of an SOI wafer and depict the execution of sequentially performed transistor processing and fabrication steps, where.

FIG. 1A shows an enlarged cross-sectional view of a small portion of a starting wafer structure that includes a semiconductor (e.g., Si) substrate 10, an electrically insulating layer which can be referred to as a buried oxide (BOX) layer 12 and a Si top layer, also referred to as an SOI layer 14 or simply as an SOI. The substrate 10 can be, for example, a p-type Si substrate and can have any suitable thickness. The BOX 12 can have a thickness in a range of, by example, about 10 nm to about 200 nm or thicker. The SOI layer 14 can have a thickness in a range of about, for example, 50 nm to about 100 nm, with about 80 nm being a suitable thickness for many applications of interest. As was mentioned previously, a bulk Si substrate can also be used (one not having the BOX layer 12.)

FIG. 1A assumes that the wafer has been pre-processed to a point where shallow trench isolation (STI) 16 has been formed in the SOI 14 for partitioning the SOI 14 into different active regions or islands 14A, 14B. The islands 14A, 14B have been implanted with suitable dopants to define in each source, drain and channel regions of a transistor that will be formed in the island. For example, Boron is a suitable channel dopant for an nFET while Arsenic is a suitable dopant for a pFET.

FIG. 1A also shows the presence of insulator layer 18, which may be referred to as a middle-of-line (MOL) insulator 18. Reference with regard to MOL insulator can be made to, for example, commonly assigned U.S. Pat. No. 7,276,751 B2, "Trench Metal-Insulator-Metal (MIM) Capacitors Integrated with Middle-of-Line Metal Contacts, and Method of Fabricating Same", Herbert L. Ho, Subramanian S. Iyer and Vidhya Ramachandran. The MOL insulator 18 can contain any suitable dielectric material(s), including, but not limited to: silicon dioxides, silicon nitrides, silicon oxynitrides, boron doped phosphorus silicate glass (BPSG), phosphosilicate glass (PSG), etc. The MOL insulator layer 18 can contain BPSG or undoped low temperature oxide that is formed by any suitable dielectric deposition processes including, but not limited to for example: high density plasma deposition (HDP) or plasma-enhanced chemical vapor deposition (PECVD).

It is assumed that the MOL insulator layer 18 has been selectively etched to expose the underling surface of the SOI 14 thereby creating openings 18A in which gate stacks will be subsequently formed. Suitable dimensions for the openings 18A are, as non-limiting examples, a depth of about 35 nm or greater and a width (which defines the channel length of the resulting FET), of about 30 nm and greater.

Figure 1B:
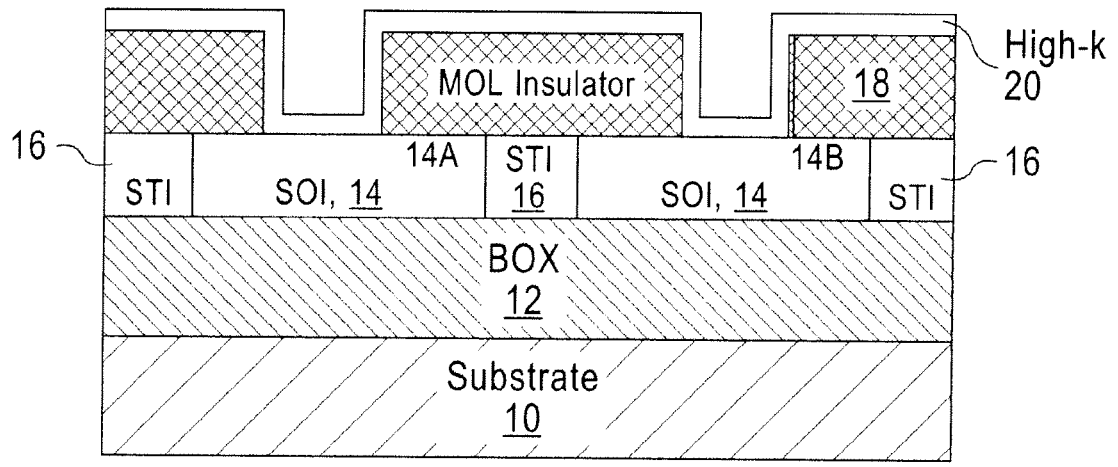

FIG. 1B shows a result of a deposition of a high dielectric constant (high-k), as compared to $SiO_2$, gate insulator layer 20. The high dielectric constant (high-k) dielectric layer 20 is formed on a top exposed surface of the SOI 14 and over the MOL insulator 18, including sidewalls of the openings 18A. The unpatterned high-k dielectric layer 20 comprises a high dielectric constant (high-k) material comprising a dielectric metal oxide and having a dielectric constant that is greater than the dielectric constant of silicon nitride of 7.5. The unpatterned high-k dielectric layer 20 may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the unpatterned high-k dielectric layer 20 may be from 1 nm to 10 nm, and more preferably from 1.5 nm to 3 nm. The unpatterned high-k dielectric layer 20 may have an effective oxide thickness (EOT) on the order of, or less than, 1 nm.

Figure 1C:
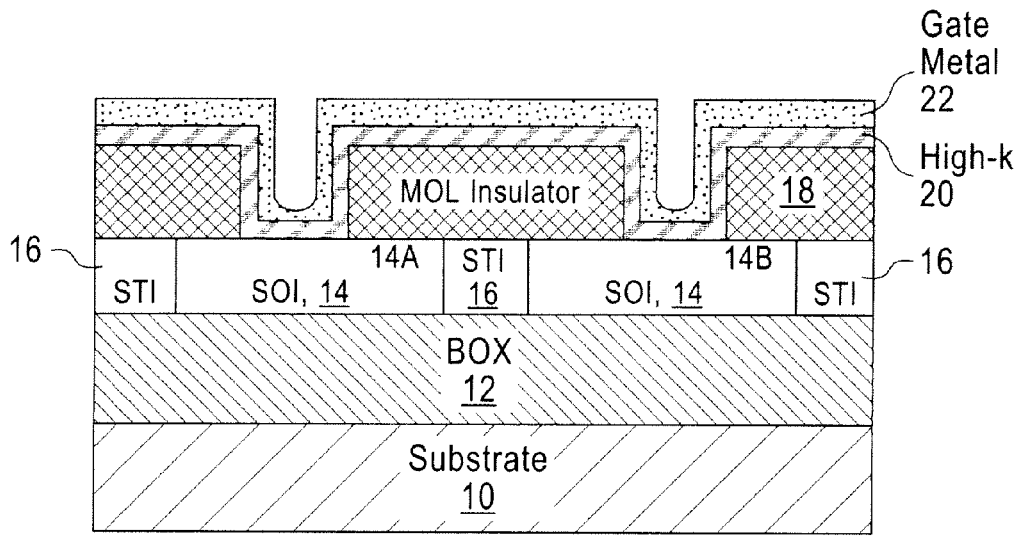

FIG. 1C shows the deposition of an unpatterned gate metal layer 22 that is deposited directly on the top surface of the unpatterned high-k dielectric layer 20. The unpatterned gate metal layer 22 may be formed, for example, by chemical vapor deposition (CVD), physical vapor deposition (PVD), or atomic layer deposition (ALD). The material of the unpatterned gate metal layer 22 may be a conductive transition metal nitride or a conductive transition metal carbide. As non-limiting examples the material of the gate metal layer 22 may be selected from TiN, TiC, TaN, TaC, and a combination thereof and can have a thickness in a range of about, for example, 20 Å to about 35 Å.

Figure 1D:
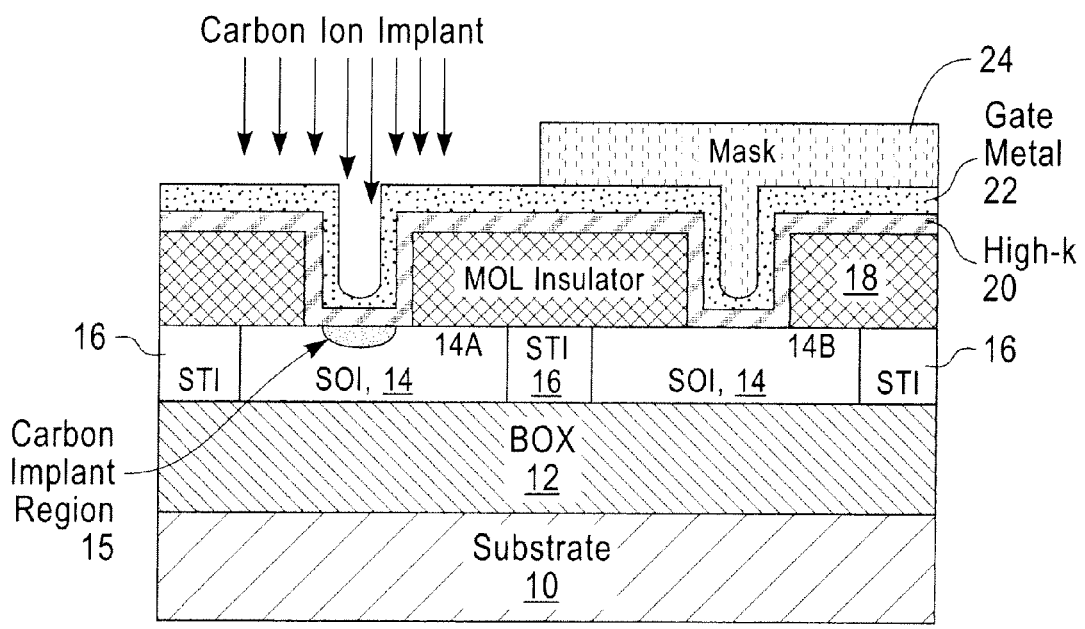

FIG. 1D shows the structure after the formation of a suitable mask 24 over the SOI island 14B, followed by the implanting of Carbon ions. The Carbon implant is such as to form a relatively shallow implant 15 (e.g., about 15 nm to about 20 nm) of Carbon into the SOI island 14A. The Carbon is implanted through the relatively thin gate metal layer 22 and gate dielectric (High-k) layer 20. The presence of the MOL insulator layer 18 around the gate stack opening 18A serves to prevent the implanting of Carbon into the source-drain regions adjacent to the channel, and thus the shallow Carbon implant 15 exists substantially only within the channel. The Carbon implant is performed to achieve a Carbon concentration in the channel that is predetermined to provide a desired value of Vt in the subsequently completed nFET.

After the implant shown in FIG. 1D the mask 24 can be stripped and another mask formed over the SOI island 14A, and another Carbon implant step can be performed to implant Carbon with a desired concentration into the channel region of the SOI island 14B. In this manner two FETs can be fabricated so as to have two different values of Vt. In addition, one of the FETs can be fabricated as an nFET while the other is fabricated as a pFET (with a different choice of gate metal 22 and channel doping).

Following the Carbon implant step(s) of FIG. 1D processing can proceed in a conventional replacement gate manner such as by annealing the structure, planarizing the structure so as to remove the gate metal 22 and gate dielectric 20 in the field, depositing a gate stack and gate contact metal, spacer formation and source-drain contact metal deposition, and performing other conventional process operations so as to complete the fabrication of the FETs.

During the Carbon implant step of FIG. 1D multiple Carbon implants can be performed using different energies, such as 8 keV that is subsequently lowered to about 5 keV, with a dose in a range of, for example, about $1 \times 10^{14}$ to about $2 \times 10^{15}$ atoms/cm$^2$. The goal is to substantially uniformly dope, through the gate metal 22 and gate dielectric 20 layers, the unmasked volume of the SOI 14 with Carbon at a desired dopant concentration such that the Carbon concentration is substantially uniform throughout the Carbon implant region 15 of the channel. Multiple Carbon implants with different energies can be used to achieve the substantially uniform Carbon doping profile.

Figure 2:
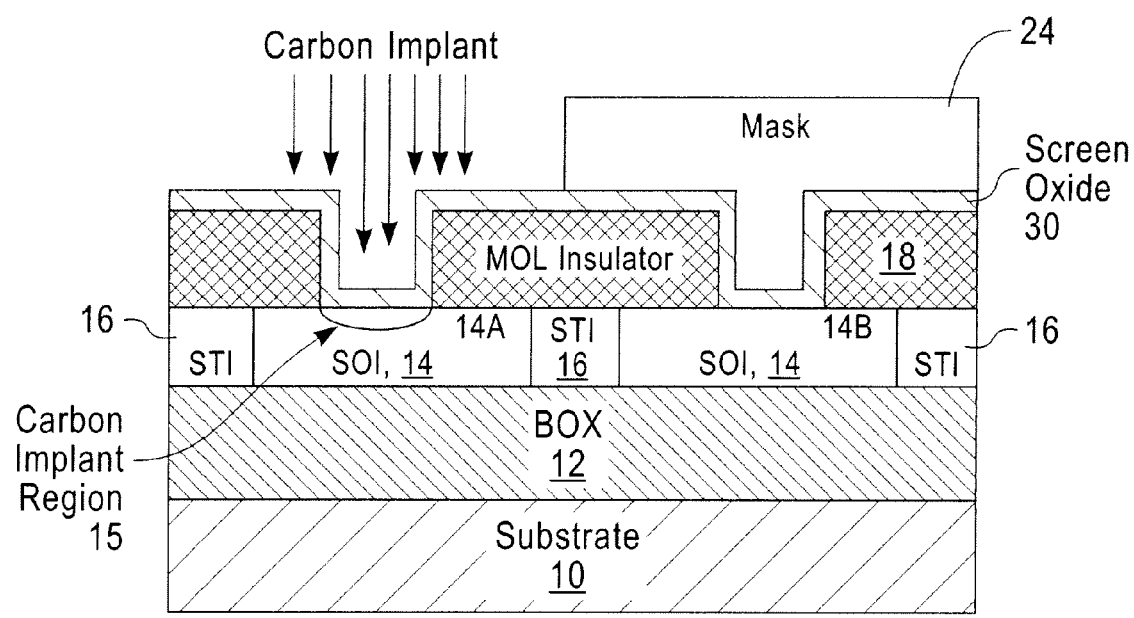
FIG. 2 shows an alternative process embodiment where the Carbon implant is performed prior to the gate insulator deposition step by implanting the Carbon through a protective layer of screen oxide.

In some embodiments of this invention the Carbon implant step can be performed prior to the deposition of the gate insulator layer 20 in FIG. 1B. In this case, and referring to FIG. 2, it may be preferred to apply a layer of screen oxide 30 comprised of, for example, SiO$_2$ to have a thickness of about 2 nm and greater. The screen oxide layer 30 can be formed on top of the Silicon (SOI) layer 14 by using, for example a low temperature deposition process. One purpose of the screen oxide layer 30 is to protect the surface of the Silicon layer 14 during the subsequent Carbon ion implant step. Following the Carbon implant step the screen oxide layer 30 and any masking layers 24 are removed and processing continues to deposit the gate insulator layer 20 and the gate metal layer 22 as shown in FIGS. 1B and 1C. In this embodiment the Carbon implant energy can be less than that of the embodiment of FIG. 1D as it is not necessary to implant the Carbon through the gate metal 22 and gate dielectric 20 layers.

Figure 3:
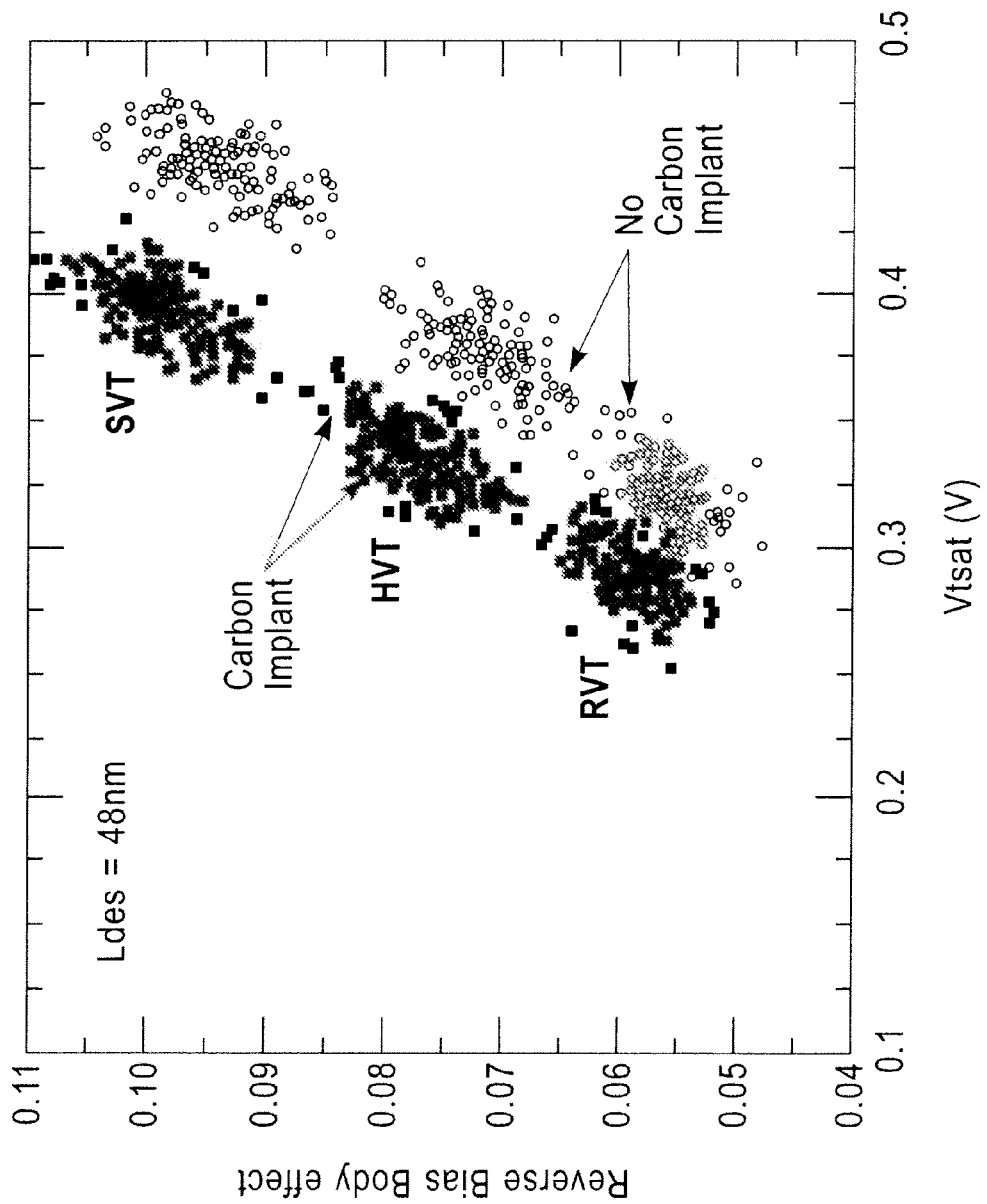
FIG. 3 is a plot of reverse bias body effect versus Vt saturation (Vtsat), where the solid circles correspond to Carbon doping and the empty circles correspond to no Carbon doping.

FIG. 3 plots reverse bias body effect versus Vt saturation (Vtsat), where the solid circles correspond to Carbon doping and the empty circles correspond to no Carbon doping. This example assumes an nFET having a channel doped with Boron ($10^{18}$ atoms/cm$^3$) for regular Vt (RVT), high Vt (HVT) and super high Vt (SVT) cases. Note the significant reduction in Vt exhibited by the Carbon-doped devices as compared to the devices that are not doped with Carbon.

In FIG. 3 Carbon is implanted for Vt reduction in 32 nm SOI. If the Vt adjustment is through the workfunction, the body effect is kept unchanged. If the Vt adjustment is through the well dopant, the body effect should be increased. By introducing Carbon, the Vt is adjusted but the body effect does not change. Therefore it can be concluded that the Vt shift achieved by the Carbon doping is a result of the modulation of the effective workfunction.

Figure 4:
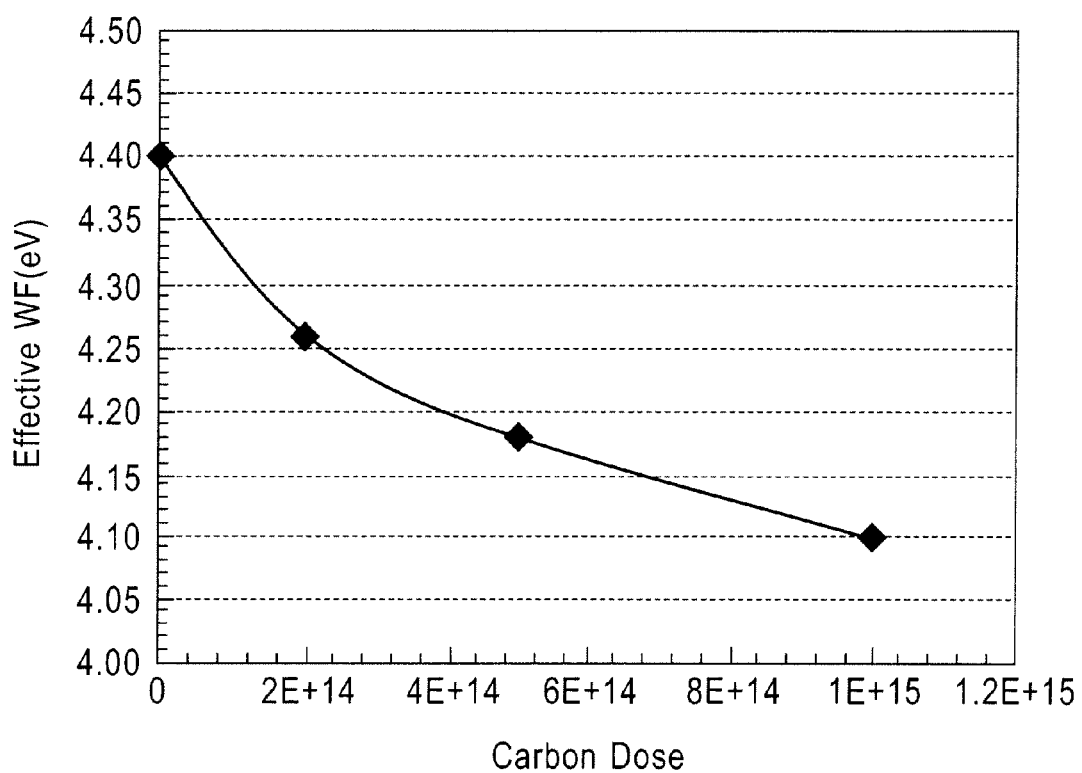
FIG. 4 is a graph that plots Carbon dose versus effective workfunction (eV).

FIG. 4 plots Carbon dose versus effective workfunction (eV). The conduction band edge is 4.05 eV. As can be seen the workfunction decreases non-linearly as the Carbon dose increases.

The various embodiments described can include a post deposit anneal (PDA) after the high-k layer deposition and the Carbon implant. The PDA can be carried out, for example, at a temperature of about 700° C. for 30 seconds.

The various dopants and doping concentrations, layer thicknesses and specific materials discussed above are exemplary and can vary from those specifically described and shown.

The exemplary embodiments of this invention can be used to fabricate integrated circuit chips that can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements that may be found in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the various layer thicknesses, feature dimensions, material types, dopant types and dopant concentrations are exemplary, and variations of the disclosed thicknesses, dimensions, material types, dopant types and dopant concentrations may be attempted by those skilled in the art. However, all such and similar modifications of the teachings of this invention will still fall within the scope of this invention.

What is claimed is:

1. A transistor, comprising:
an insulator layer disposed on a surface of a semiconductor body, the insulator layer having an opening made therein;
a channel formed in the semiconductor body within the opening;
a high dielectric constant gate insulator layer disposed over a surface of an upper portion of the channel within the opening;
a gate metal layer disposed over the high dielectric constant gate insulator layer within the opening, and
a Carbon doped region that exists only within the channel beneath the high dielectric constant gate insulator layer and the gate metal layer, the Carbon doped region being disposed adjacent to the surface of the upper portion of the channel, where Carbon within the Carbon doped region has a substantially uniform concentration that is selected to set a value of an effective workfunction for the transistor so as to establish a desired voltage threshold value for the transistor.

2. The transistor of claim 1, where the Carbon concentration is in a range of about $2\times10^{14}$ to about $5\times10^{15}$ atoms/cm$^3$.

3. The transistor of claim 1, where the semiconductor body is a Silicon-on-Insulator (SOI) layer.

4. The transistor of claim 1, where the semiconductor body is a bulk semiconductor.

5. The transistor of claim 1, where the value of the workfunction decreases in a non-linear manner as the Carbon concentration increases.

6. The transistor of claim 1, where the gate metal layer comprises a part of a gate stack.

7. The transistor of claim 1, where the high dielectric constant gate insulator layer is comprised of a layer having a thickness in a range of about 1.5 nm to about 3 nm.

8. The transistor of claim 1, where the gate metal layer is comprised of one of a conductive transition metal nitride or a conductive transition metal carbide.

9. The transistor as in claim 1, where the insulator layer having the opening made therein is a middle-of-line (MOL) insulator layer.

10. A structure comprising:
a layer of semiconductor material;
an insulator layer disposed upon a surface of the layer of semiconductor material, the insulator layer having a first opening made therein and a second opening made therein;
a first field effect transistor formed at least partially in the layer of semiconductor material within the first opening; and
a second field effect transistor formed at least partially in the layer of semiconductor material within the second opening; where
the first field effect transistor is comprised of, within the first opening, a gate insulator layer disposed over a surface of a channel formed in the layer of semiconductor material and a gate metal layer disposed over the gate insulator layer, and a Carbon doped region that exists only within the channel of the first field effect transistor beneath the gate insulator layer and the gate metal layer, the Carbon doped region being disposed adjacent to the surface of the upper portion of the channel, where Carbon within the Carbon doped region has a substantially uniform first concentration that is selected to set a value of an effective workfunction for the first field effect transistor so as to establish a desired voltage threshold value for the first field effect transistor;
the second field effect transistor is comprised of, within the second opening, a gate insulator layer disposed over a surface of a channel formed in the layer of semiconductor material and a gate metal layer disposed over the gate insulator layer, and a Carbon doped region that exists only within the channel of the second field effect transistor beneath the gate insulator layer and the gate metal layer, the Carbon doped region being disposed adjacent to the surface of the upper portion of the channel, where Carbon within the Carbon doped region has a substantially uniform second concentration that is selected to set a value of an effective workfunction for the second field effect transistor so as to establish a desired voltage threshold value for the second field effect transistor.

11. The structure as in claim 10, where the second Carbon concentration differs from the first Carbon concentration such that voltage threshold of the second field effect transistor differs from the voltage threshold of the first field effect transistor.

12. The structure as in claim 10, where the Carbon concentration is in a range of about $2\times10^{14}$ to about $5\times10^{15}$ atoms/cm$^3$.

13. The structure as in claim 10, where the layer of semiconductor material is a Silicon-on-Insulator (SOT) layer.

14. The structure as in claim 10, where the layer of semiconductor material is a bulk semiconductor.

15. The structure as in claim 10, where the value of the workfunction decreases in a non-linear manner as the Carbon concentration increases.

16. The structure as in claim 10, where the gate metal layer comprises a part of a gate stack.

17. The structure as in claim 10, where the gate insulator layer is comprised of a high dielectric constant gate insulator layer having a thickness in a range of about 1.5 nm to about 3 nm.

18. The structure as in claim 10, where the gate metal layer is comprised of one of a conductive transition metal nitride or a conductive transition metal carbide.

19. The structure as in claim 10, where the insulator layer having the first opening and the second opening made therein is a middle-of-line (MOL) insulator layer.

20. The structure as in claim 10, where the insulator layer having the first opening and the second opening made therein is comprised of dielectric material comprising at least one of silicon dioxide, silicon nitride, silicon oxynitride, boron doped phosphorus silicate glass (BPSG) and phosphosilicate glass (PSG).

* * * * *